United States Patent
Case et al.

(10) Patent No.: US 6,879,376 B2
(45) Date of Patent: Apr. 12, 2005

(54) METHOD AND APPARATUS FOR EXPOSING PHOTORESISTS USING PROGRAMMABLE MASKS

(75) Inventors: Andrew Case, Silver Springs, MD (US); Gregory D. Cooper, Alexandria, VA (US); Erin Fleet, Alexandria, VA (US)

(73) Assignee: Pixelligent Technologies LLC, Vienna, VA (US)

( * ) Notice: Subject to any disclaimer, the term of this patent is extended or adjusted under 35 U.S.C. 154(b) by 0 days.

(21) Appl. No.: 10/298,224

(22) Filed: Nov. 18, 2002

(65) Prior Publication Data

US 2003/0117598 A1 Jun. 26, 2003

Related U.S. Application Data

(60) Provisional application No. 60/331,515, filed on Nov. 19, 2001.

(51) Int. Cl.[7] .................. G03B 27/42; G03B 27/32; G03B 27/54; G03C 5/00
(52) U.S. Cl. .................. 355/53; 355/67; 355/77; 430/312; 430/313; 430/394
(58) Field of Search ............................. 355/53, 75, 77; 430/5, 22, 311, 312, 313, 394; 359/224, 855

(56) References Cited

U.S. PATENT DOCUMENTS 5,739,898 A * 4/1998 Ozawa et al. ............. 355/53
5,847,812 A * 12/1998 Ooki et al. ................ 355/67
6,084,656 A    7/2000 Choi et al.
6,094,256 A    7/2000 Grodnensky et al.
6,379,867 B1   4/2002 Mei et al.

FOREIGN PATENT DOCUMENTS

JP    2000-21757 A  * 1/2000

OTHER PUBLICATIONS

M. Fritze, J. Burns, et al., "Sub–100 nm silicon in insulator complementary metal–oxide semiconductor transistors by deep ultraviolet optical lithography," *J. Vac. Sci. Technol.* B. 18(06), Nov./Dec. 2000, pp. 2886–2891.

D. Gelbart, "248nm thermoresist: 0.1 micron imaging without proximity effects," in Emerging lithographic technologies III, Y. Vladimirsky, ed., Proc, SPIE v.3676, 1999.

* cited by examiner

*Primary Examiner*—Alan Mathews
(74) *Attorney, Agent, or Firm*—Nixon & Vanderhye P.C.

(57) ABSTRACT

Method and apparatus for exposing photo resists using programmable masks increases imaging resolution to provide fully dense integrated circuit patterns made of very small features on photoresist-coated silicon wafers by optical lithography. Small features are created by means of overlap exposure with either programmable or conventional masks. Blocking photoresists responding differently to two different wavelengths of light, two-color photoresists requiring two wavelengths of light to change solubility, and two-photon photoresists which change solubility only by absorbing two photons at a time may be used.

8 Claims, 10 Drawing Sheets

METHOD AND APPARATUS FOR EXPOSING PHOTORESISTS USING PROGRAMMABLE MASKS

CROSS-REFERENCES TO RELATED APPLICATIONS

This application claims the benefit of Provisional Application No. 60/331,515, filed Nov. 19, 2001, now U.S. Pat. No. 6,480,261, the entire content of which is hereby incorporated by reference in this application.

This application is related to commonly-assigned application Ser. No. 09/871,971 to Cooper et al. entitled "Photolithographic System For Exposing A Wafer Using A Programmable Mask" filed Jun. 4, 2001, incorporated herein by reference.

STATEMENT REGARDING FEDERALLY SPONSORED RESEARCH OR DEVELOPMENT

Not applicable.

FIELD OF TEE INVENTION

This invention relates to the use of a programmable mask for exposing a photoresist. Still more particularly, the present invention relates to techniques for improving lithography performance by coordinating the movement of the programmable mask (and/or wafer), the timing of the opening and closing of the shutters, and/or knowledge of the resist exposure and contrast mechanism.

BACKGROUND OF THE INVENTION

Lithography is the process of transferring an image from a photomask onto a silicon wafer. Since 1971, advances in lithography have allowed integrated circuit (IC) manufacturers to reduce minimum feature sizes from 10 microns to 0.13 microns. This steady miniaturization has enabled improvements in IC performance and growth in the semiconductor industry.

I.A The Lithography Process

The primary lithography tool is a wafer stepper, which generally consists of a light source, a photomask holder, an optical system for projecting and demagnifying the image of the mask onto a photoresist-coated wafer, and a stage to move the wafer. Lithography also requires a photomask, a quartz substrate with chrome lines on one surface. The chrome lines form a perfect master of the pattern to be inscribed on one layer of a chip.

The stepper shines light from a laser onto the photomask. A 4× reduction lens focuses the light to form an image on a silicon wafer. This image consists of a pattern of light and dark—light where the photons passed through the bare quartz; dark where the chrome lines cast shadows. The light exposes photoresist, a photosensitive chemical, on the wafer.

The industry uses two types of photoresist, referred to as "positive" and "negative." Positive photoresist is insoluble when first applied, and the light "softens" it, or renders it more soluble. Negative photoresist has the opposite characteristics: it is soluble, when first applied, and the light "hardens", it or renders it more soluble.

In both cases, the next step is to "develop" the photoresist; i.e., to apply a solvent known as a developer to remove the more soluble photoresist. The less soluble photoresist remains on the wafer to protect the underlying material from a subsequent processing step. This processing step can be an etch to remove material that is unprotected by photoresist. In this way, lithography transfers the pattern from the mask onto the wafer. By repeating this technique several times using different photomasks, it is possible to build multi-layered semiconductor structures (e.g., transistors) and associated interconnecting electrical circuits.

I.B The Lithographer's Equation

Within the limitations of this prior art lithography paradigm, the "lithographer's equation" determines the resolution, or the smallest feature that can be inscribed on the wafer: Resolution=$k_1 \times \lambda/NA$, where $\lambda$ (lambda) is the wavelength of the stepper light, NA is the numerical aperture of the stepper lens, and $k_1$ is a "process factor" which several contributors can influence. The lithographers' equation says that there are three ways to write smaller features on a wafer:

Decrease the exposure wavelength. Since 1986, new generations of steppers have reduced the exposure wavelength from 468 nm (the "g-line" of a mercury vapor lamp) to 365 (the "i-line of a mercury vapor lamp), to 248-nm (light from a krypton fluoride excimer laser, and most recently to 193 nm (light from an argon fluoride excimer laser).

Reduce the $k_1$ factor. This catch-all category embraces everything that lithographers can do to improve resolution without decreasing the exposure wavelength or increasing the numerical aperture of the stepper lens. For example, lithographers can reduce $k_1$ by adjusting the orientation or the shape of the illumination beam. The most important ways of lowering $k_1$ have required changes in the photomask. Sub-wavelength resolution requires masks with optical proximity correction and phase-shift techniques.

Increase the numerical aperture of the stepper lens. The NA of the stepper lens is the sine of the angle between the normal and the outside of the cone of light striking the photomask. It is possible to print smaller features by increasing the NA of the lens. A higher NA requires a larger, more expensive lens.

Table 1 shows how the semiconductor industry and its suppliers have changed the exposure wavelength ($\lambda$), $k_1$, and the NA of the stepper lens over the past 15 years.

TABLE 1

Evolution of $k_1$, $\lambda$, and NA

| Year | Linewidth (μm) | λ (nm) | $K_1$ | NA |
|---|---|---|---|---|
| 1986 | 1.0 | 436 | 1.00 | .38 |
| 1989 | 0.7 | 365 | 0.86 | .45 |
| 1992 | 0.5 | 365 | 0.74 | .54 |
| 1995 | 0.35 | 365 | 0.57 | .60 |
| 1997 | 0.25 | 365 | 0.50 | .60 |
| 1999 | 0.18 | 248 | 0.43 | .70 |
| 2001 | 0.13 | 248 | 0.39 | .75 |

I.C The State of the Art

Today semiconductor manufacturers are creating circuits with 130-nanometer features by exposing wafers in steppers with 248-nm light from krypton fluoride excimer lasers. They achieve the low $k_1$ factor of 0.39 with the aid of special masks which contain phase shifters and optical proximity correction features. The key point is that in commercial-scale production, the industry has found no way to expose features which are smaller than approximately half the exposure wavelength.

I.D The Semiconductor Industry's Lithography Roadmap

Table 2 shows the semiconductor industry's lithography roadmap for the future, according to International SEMATECH.

TABLE 2

Semiconductor Industry's Lithography Roadmap

| Minimum Feature Size (nm) | Year | Exposure Technique |
| --- | --- | --- |
| 130 | 2001 | Optical, 248 nm krypton fluoride laser |
| 90 | 2004 | Optical, 193-nm argon fluoride laser |
| 65 | 2007 | Optical, 157-nm fluorine laser |
| 45 | 2010 | EUV Lithography and/or EPL |

Table 2 indicates that the industry will introduce 193-nm optical lithography for the 90-nm generation of integrated circuits in 2004 and 157-nm optical lithography for the 65-nm generation of integrated circuits in 2007. Both of these techniques expose photoresist with deep ultraviolet light from lasers.

The semiconductor industry's roadmap assumes that optical lithography cannot produce circuits with minimum feature sizes much below 65 nanometers. Semiconductor manufacturers expect to adopt either extreme ultra-violet (EUV) lithography or electron projection lithography (EPL) for the 45-nm generation of integrated circuits.

EUV lithography exposes the wafer with 13.4-nm radiation (soft X-rays). Since virtually no materials are transparent to radiation at that wavelength, the technology requires reflective masks and lenses. EPL exposes the wafer with electrons rather than with photons. Industry consortia are investing heavily to develop EUV and EPL lithography. Both technologies involve substantial technical risk, schedule risk, and economic risk. Furthermore, they may significantly increase the costs of lithography. For these reasons, the industry will have great interest in new methods of optical lithography which would enable steppers with optical wavelengths (248 nm, 193 nm, and 157 nm) to produce smaller features than presently expected.

To provide a foundation for the discussion of our novel methods, we now turn to the properties of conventional photoresists.

I.E Properties of Conventional "Integrating" Photoresist

A conventional photoresist changes its solubility when exposed to light. For example, FIG. 1 shows how the solubility of positive photoresist changes as it receives increasing amounts of light energy (photons per unit area). As the energy increases from zero, the solubility remains low at first. Then as the applied energy approaches some threshold ($E_0$), the solubility increases quickly to some high level and then levels off. The transition from insoluble to soluble occurs over a rather narrow range of energy $\Delta E$.

The time over which the photons strike the photoresist is not a factor. The curve shown in FIG. 1 is valid regardless of whether the photoresist receives low-intensity light for a relatively long time or high-intensity light for a relatively short time. Furthermore, the application of light need not be continuous. If the photoresist receives only a sub-threshold amount of light energy, say 50% of the threshold value, or $E_0/2$, it "remembers" that energy. Another dose of energy equal to $E_0/2$ applied at some later time will catalyze the photoresist (to "catalyze" photoresist means to change its solubility). We refer to resists of this type as "integrating" resists because they integrate the energy applied over time.

I.F Proof of Principle of 40-nm Features with 248-nm Lithography

It is possible to create 40 nm resist features with a 248-nm stepper by a chromeless phase shift approach.[1] FIG. 2 represents the distribution of light which that approach projected onto the photoresist. The phase shift technique created a positive amplitude on one side and a negative amplitude on the other. The photoresist is sensitive only to the intensity of the light, which equals the square of the amplitude and is therefore a positive number. The intensity distribution shown contains a narrow sub-threshold region in the center. This region prints on the photoresist as a narrow dark line. This photoresist line has a width of 40 nm.

[1] See M. Fritze, J. Burns, et al., "Sub-100 nm silicon in insulator complementary metal-oxide semiconductor transistors by deep ultraviolet optical lithography," *J. Vac. Sci. Technol, B* 18(06), November/December 2000, pp. 2886–2891.

From a practical standpoint, the main limitation with this technique is that it can create only semi-isolated gate features, not fully dense integrated circuits. Ideally, it would be useful to print densely packed lines and spaces in which the spaces had the same dimensions as the width of the lines. It would be impossible to print a second dark line close to the one shown in FIG. 2. The second dark line would have to be far enough away from the original dark line to ensure that the tail of its intensity curve would lie totally outside the original dark line. Otherwise, the light from the second exposure would add to the sub-threshold exposure within the original dark line and catalyze the resist in that area.

I.G Non-Integrating Photoresists

Researchers have demonstrated another category of photoresist which we refer to as "non-integrating" photoresists. If these photoresists receive a sub-threshold dose of light energy, they relax back into their original state after a characteristic relaxation time. For example, multiple doses of light below the threshold value will not catalyze this type of photoresist, provided only that these doses are separated in time by at least the characteristic relaxation time.

One class of non-integrating resist is resists which respond to temperature. These thermoresists (also called thermochroic resists) change solubility irreversibly once they have been raised above a certain temperature.[2] If the resist is raised to an elevated temperature below the critical temperature, it is unchanged. This means that if light is used to heat the resist, only those areas of resist heated above the critical temperature will be exposed, and once the light is turned off, the resist will cool, so that the areas heated to below the critical temperature will effectively 'forget' that they were ever heated.

[2] D. Gelbart, "248 nm thermoresist: 0.1 micron imaging without proximity effects," in Emerging lithographic technologies III, Y. Vladimirsky, ed., Proc. SPIE v.3676, 1999.

We will disclose a lithography strategy to exploit the properties of thermochroic photoresists and other non-integrative photoresists.

SUMMARY OF THE INVENTION

The present invention provides fully dense integrated circuit patterns made of very small features on photoresist-coated silicon wafers by optical lithography.

An example illustrative embodiment creates small features on photoresist-covered silicon wafers by means of overlap exposure with either programmable masks or conventional masks. We will also disclose how to pack those small features densely by using non-integrative photoresists.

An example illustrative embodiment inscribes fully dense integrated circuit patterns with small features on a silicon wafer covered with three other types of photoresist: a blocking photoresist, which responds differently to two different wavelengths of light; a "two-color" photoresist, which requires two wavelengths of light to change its solubility; and a "two-photon" photoresist, which changes its solubility only by absorbing two photons at a time.

Although we describe these methods as ways of creating integrated circuit patterns for clarity of exposition, they are equally suitable for other applications of lithography, such as creating flat panel displays or printed circuit boards.

BRIEF DESCRIPTION OF THE DRAWINGS

These and other features and advantages provided by the invention will be better and more completely understood by referring to the following detailed description of presently preferred embodiments in conjunction with the drawings. The file of this patent contains at least one drawing executed in color. Copies of this patent with color drawing(s) will be provided by the Patent and Trademark Office upon request and payment of the necessary fee. The drawings are briefly described as follows.

DETAILED DESCRIPTION OF PRESENTLY PREFERRED EXEMPLARY EMBODIMENTS

Non-Integrating Photoresists

Figure 3:
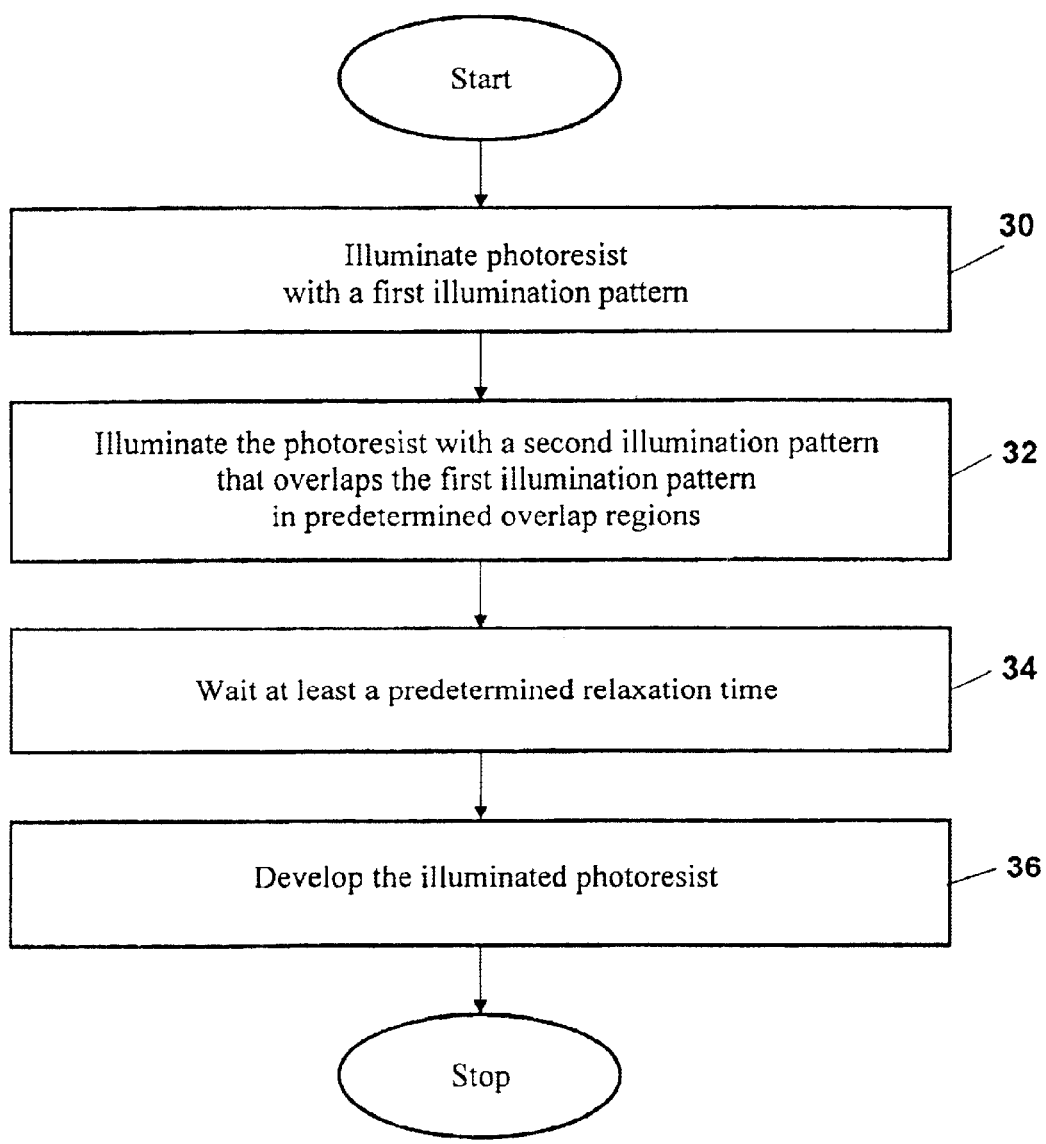
FIG. 3 shows an example illustrative process for exposing a non-integrating resist.

One novel method of creating fully dense integrated circuit patterns made of very small features on photoresist-coated silicon wafers by optical lithography involves catalyzing a non-integrating resist on a substrate by overlap exposure, as shown in FIG. 3. The substrate could be a silicon wafer, a flat panel display, a printed circuit board, or any other suitable target for lithography. The first step (block 30) is to illuminate the non-integrative photoresist with a first illumination pattern, which could be a line, a square, a rectangle, a circle, an oval, or a more complex pattern. The second step (block 32) is to illuminate the non-integrative photoresist with a second illumination pattern that overlaps the first illumination pattern in predetermined overlap regions.

The interval between the first illumination step (block 30) and the second illumination step (block 32) must not exceed the relaxation time of the non-integrative photoresist. In fact, the first and second illumination steps could occur simultaneously.

In this method, we select the appropriate intensity of the light and the appropriate duration of the exposure so that the overlap region, and only the overlap region, receives energy equal to or greater than the threshold of the photoresist. Therefore only the overlap region undergoes a solubility change. The overlap region could be only a small percentage, say 10% of the area of each illumination pattern.

The third step (block 34) is to wait at least a predetermined relaxation time, namely the time required for the non-overlap regions of the non-integrative photoresist to relax back into their original state.

The fourth step (block 36) is to develop the photoresist; i.e., to apply a solvent and thereby remove the photoresist's high-solubility region or regions.

This method can enable optical lithography to create smaller features than the light distribution on the photoresist and thus smaller features on the silicon wafer.

Multiple variations on this method could be advantageous, depending on various conditions. For example, the illumination pattern created in the first step (block 30) and the illumination pattern created in the second step (block 32) could be identical patterns, or they could be different patterns.

In both the first illumination step (block 30) and the second illumination step (block 32), it would be possible to create the illumination patterns with any type of photomask, including a conventional binary chrome-on-quartz mask, a chrome-on-quartz mask with optical proximity correction features, or any type of phase shift mask.

It would also be possible to create the illumination patterns with a programmable photomask. The programmable photomasks could be of any type, including those which employ liquid crystals, movable mirrors, or absorption-based mechanisms to open and close the shutters. Under certain circumstances, it would be useful to create the overlap regions by holding the programmable photomask stationary relative to the photomask and opening and shutting adjacent shutters on the programmable photomask. Under other circumstances, it would be useful to create the first illumination pattern (block 30) and the second illumination pattern (block 32) by scanning the substrate relative to the programmable mask while changing the programming of the programmable mask to provide different exposure patterns at different times. It would be possible to reprogram the mask while scanning.

In some cases, it would be advantageous to carry out both the first illumination step (block 30) and the second illumination step (block 32) with the same photomask. In these cases, it could be useful to move the substrate relative to the photomask between the two illumination steps in order to create the overlap regions.

Figure 4:
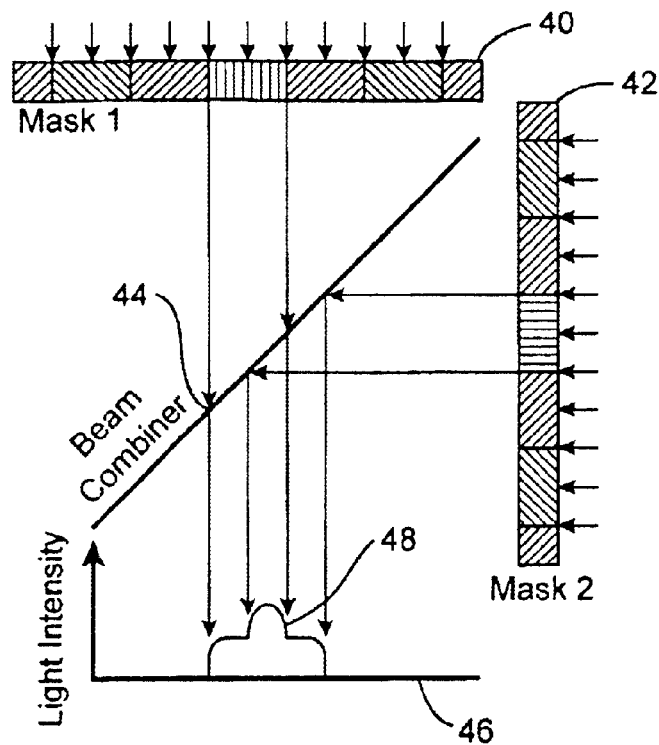
FIG. 4 shows an example illustrative arrangement using two masks to create overlap regions in a non-integrating resist.

In other cases, it would be useful to carry out the first illumination step (block 30) and the second illumination step (block 32) with two different photomasks, as shown in FIG. 4. FIG. 4 shows a first mask (40), a second mask (42), a beam combiner (44) (such as a partially silvered mirror), a substrate (46), and the resultant light intensity profile with greater intensity in the overlap region (48). The two photomasks could be any type of photomask, including a conventional binary chrome-on-quartz mask, a chrome-on-quartz mask with optical proximity correction features, any type of phase shift mask, or any type of programmable photomask. The two photomasks could be of the same type, or of different types.

Figure 5:
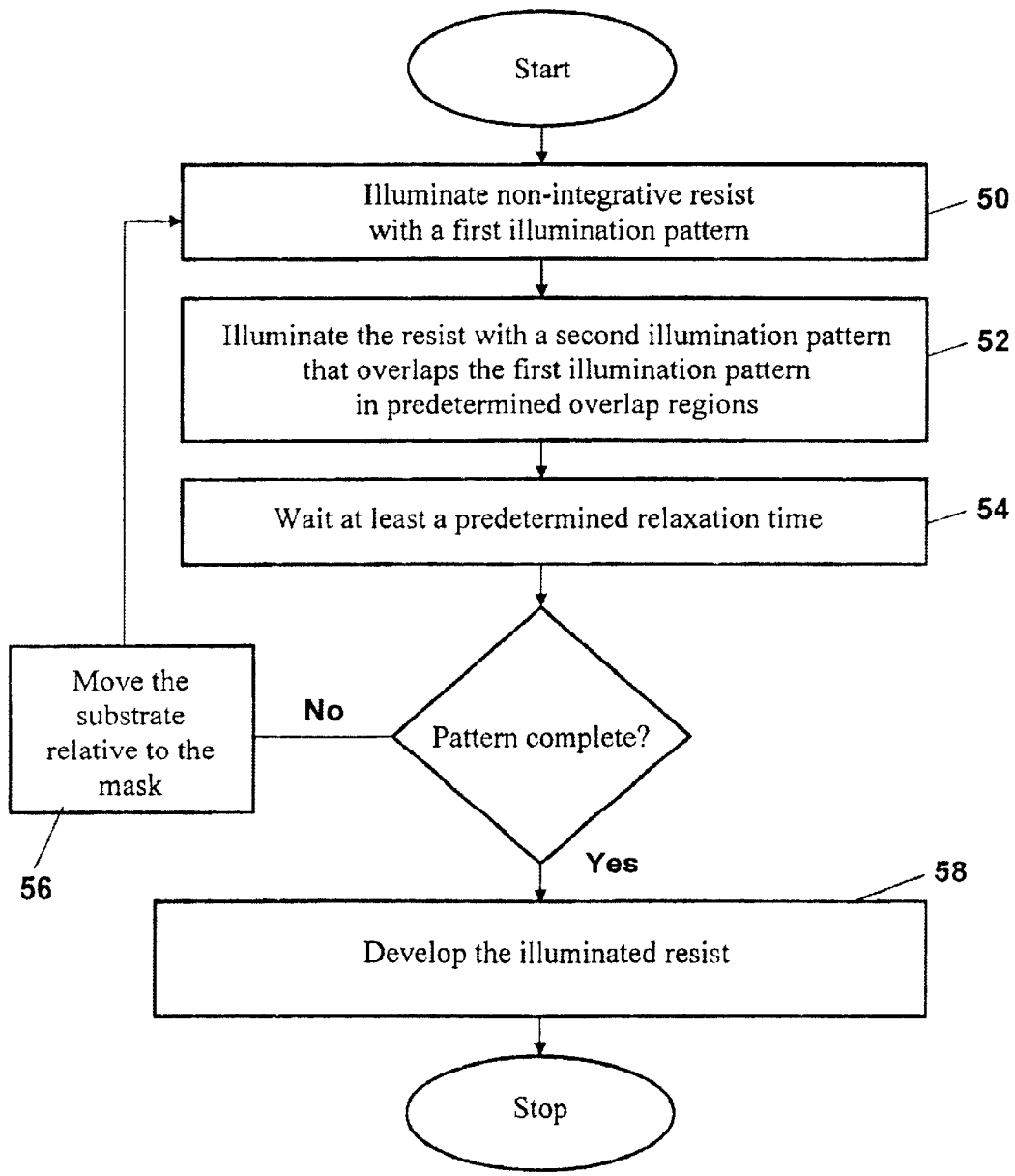
FIG. 5 shows an example illustrative process for exposing a non-integrating resist.
Figure 6A:
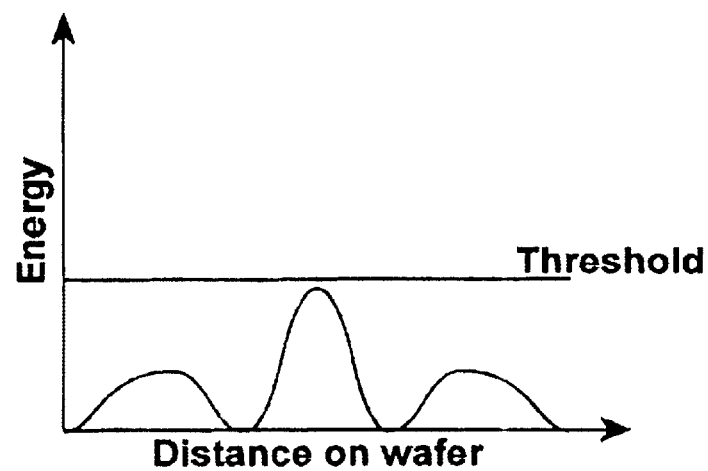
FIG. 6 shows three example illustrative intensity distributions with a central peak and relatively less intense side lobes for different exposure times.
Figure 6B:
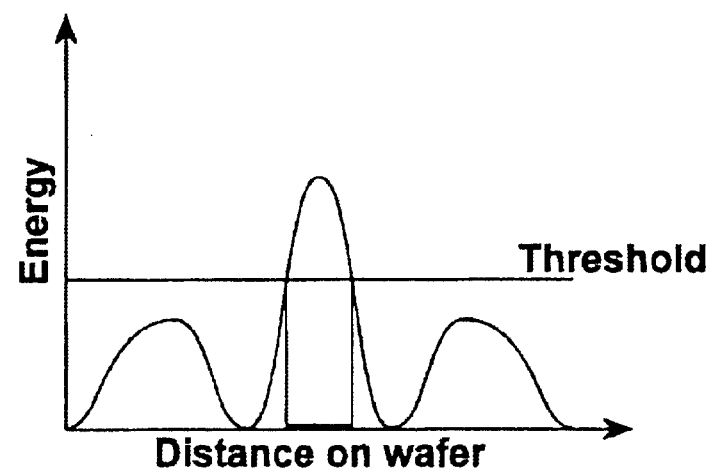
Figure 6C:
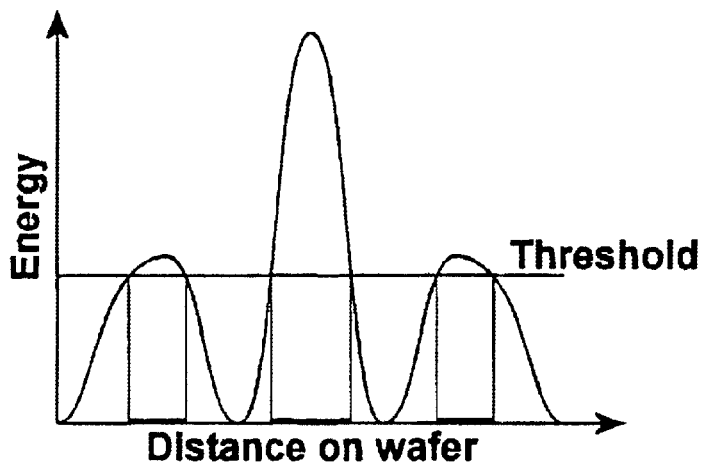

To create more complex patterns, is possible to repeat the illumination steps an arbitrary number of times, as shown in FIG. 5. The first step (block 50) is to illuminate the non-integrative photoresist with a first illumination pattern. The second step (block 52) is to illuminate the non-integrative photoresist with a second illumination pattern that overlaps the first illumination pattern in predetermined overlap regions. The third step (block 54) is to wait at least a predetermined relaxation time, namely the time required for the non-overlap regions of the non-integrative photoresist to relax back into their original state.

The fourth step is to move the substrate relative to the mask (block 56) and repeat the previous three steps (blocks 50, 52, and 54) as many times as necessary as part of a movement strategy to expose a complete pattern.

The fifth step (block 58) is to develop the illuminated resist. Again, the overlap regions of the non-integrative photoresist acquire a different solubility from other regions of the non-integrative photoresist.

Here, too, the interval between the first illumination step (block 50) and the second illumination step (block 52) must not exceed the relaxation time of the non-integrative photoresist. We select the appropriate intensity of the light and the appropriate duration of the exposure so that the overlap region, and only the overlap region, receives energy equal to or greater than the threshold of the photoresist. Therefore only the overlap region undergoes a solubility change.

The non-integrative resist makes it possible to repeat the illumination steps (blocks 50 and 52) many times to create the complete pattern of an integrated circuit or another device. The areas of the non-integrative resist in the non-overlap regions received sub-threshold doses of light energy. After the appropriate relaxation time, those non-overlap regions relax back to their original state; i.e., they "forget" that they received any illumination at all. The sub-threshold doses of illumination which they receive in one exposure do not add to other sub-threshold doses of illumination which might receive in later exposures. As a result, it is possible to repeat the process in closely adjoining regions without catalyzing the photoresist in unwanted areas. This method makes it possible to create fully dense features integrated circuits with very small feature sizes.

Non-Integrating Resists and Light Intensity Distributions with Side Lobes

One way to expose a photoresist is to use multiple exposure with a programmable mask whose pixels have light intensity distributions with side lobes such as for example an Airy distribution. Unfortunately, when this technique is applied to exposing a complete pattern on a photoresist-coated silicon wafer, the cumulative power from the side lobes of several pixels over several exposures might catalyze the photoresist in undesirable places. Non-integrative photoresists make it possible to avoid this problem.

Figure 7:
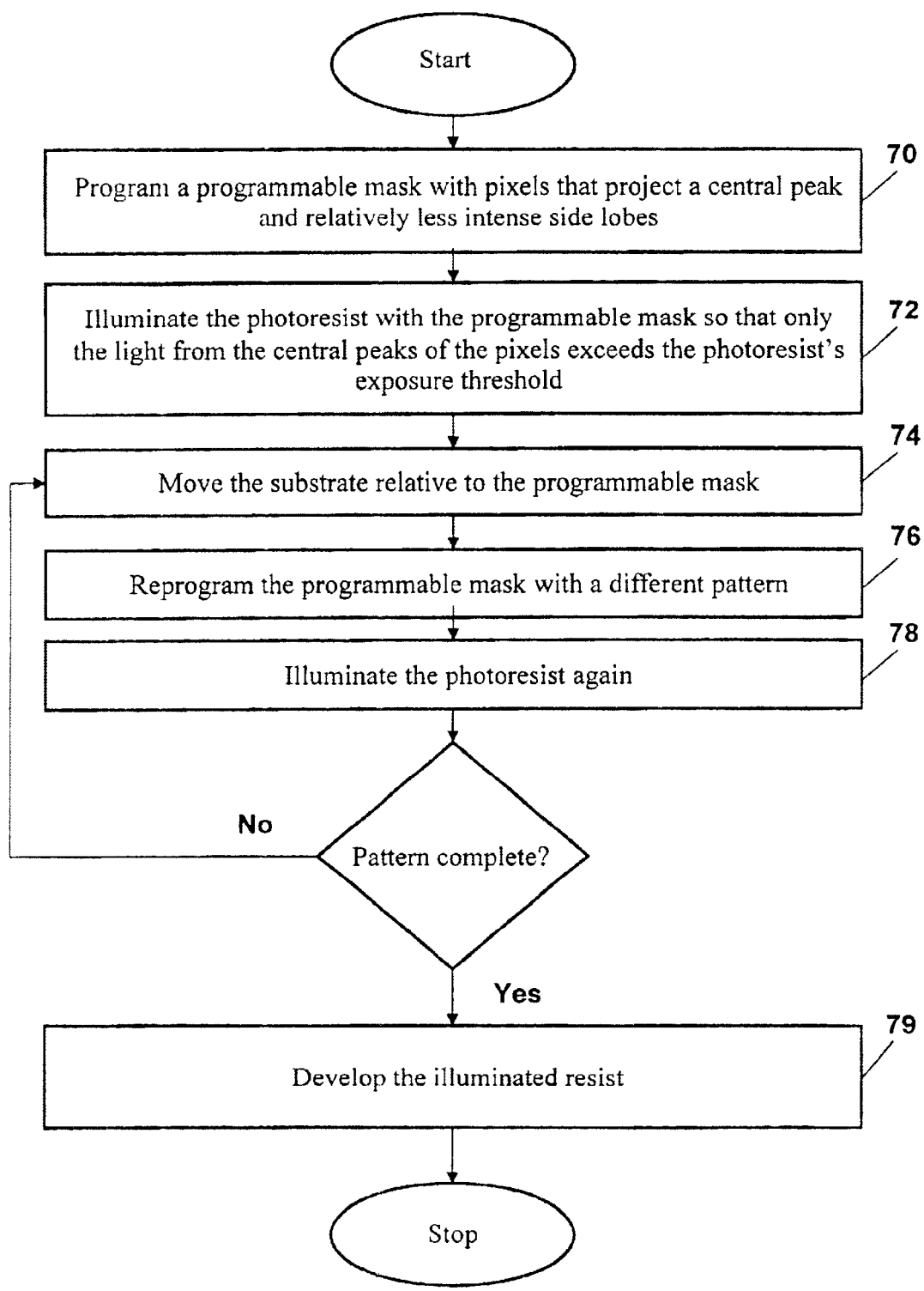
FIG. 7 shows an example illustrative non-integrating resist exposure process using a programmable mask that projects pixels with a central peak and relatively less intense side lobes.

We disclose a novel method (illustrated in FIG. 7) of inscribing a complete pattern on a non-integrating photoresist on a silicon wafer (or any other substrate) with a programmable photomask by means of a series of exposures.

The first step (block 70) is to program a programmable photomask with a pattern. The programmable mask has a plurality of pixels with characteristic intensity patterns having a narrow central peak and sidelobes. Each such pixel produces a light intensity pattern at the photoresist consisting of a central peak with relatively high intensity and side lobes with intensities below the intensity of the central peak.

The second step (block 72) is to illuminate the photoresist with the programmable mask. The duration of the illumination should be long enough that the light from the central peaks exceeds the exposure threshold of the photoresist, but short enough that the light from the side lobes doesn't exceed the exposure threshold.

The third step (block 74) is to move the substrate relative to the photomask.

The fourth step (block 76) is reprogram the programmable mask with a different pattern. (It would be possible to invert the order of the third and fourth steps.)

The fifth step (block 78) is to illuminate the photomask again. This illumination step should not occur until after a predetermined relaxation time, so the photoresist can return to its original state. The duration of the illumination should be long enough that the light from the central peaks exceeds the exposure threshold of the photoresist, but short enough that the light from the side lobes doesn't exceed the exposure threshold.

In many cases, it will be necessary to repeat the third, fourth, and fifth steps (blocks 74, 76, and 78 in FIG. 7) as many times as necessary to expose a complete pattern.

The final step is to develop the photoresist.

Blocking Photoresists

We disclose another novel method of inscribing small features on a photoresist-covered wafer with the aid of a blocking photoresist. A blocking photoresist is a photoresist that responds differently to two different wavelengths of light. Light with the second wavelength can catalyze the photoresist in the absence of light with the first wavelength. However, the presence of light with the first wavelength (the "blocking wavelength") prevents light with the second wavelength from catalyzing the photoresist during the period when light with the first wavelength is shining on the resist and for a specified relaxation time thereafter.

Figure 1:
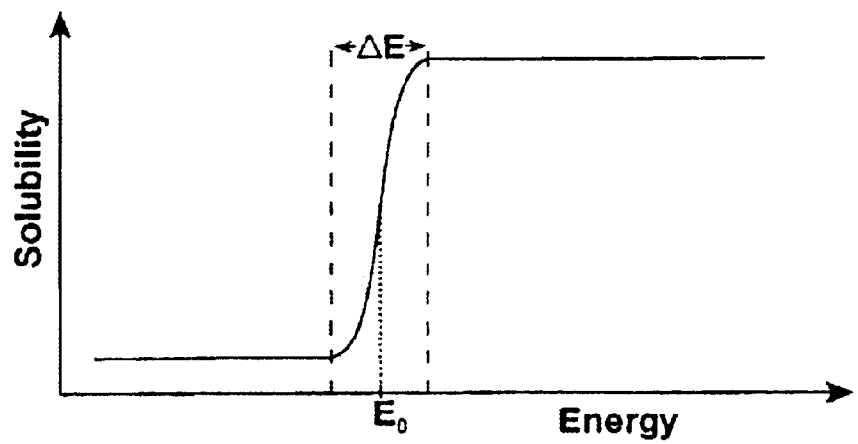
FIG. 1 is an example illustrative exposure curve for a conventional integrating resist.
Figure 2:
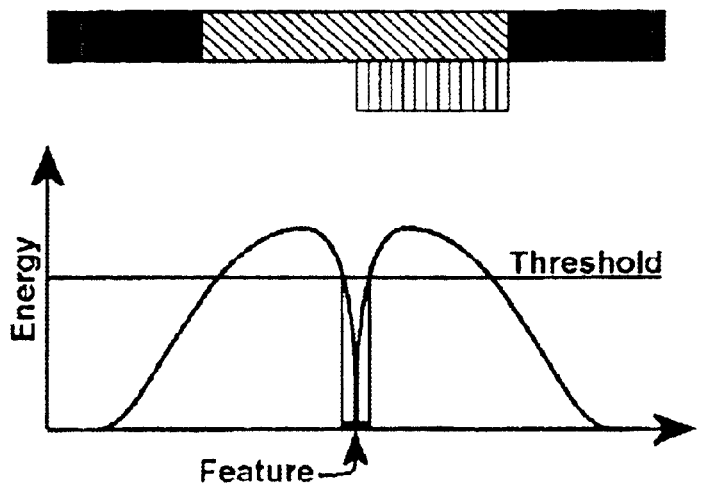
FIG. 2 represents the light distribution at the wafer from a chromeless phase-shift mask technique.
Figure 8:
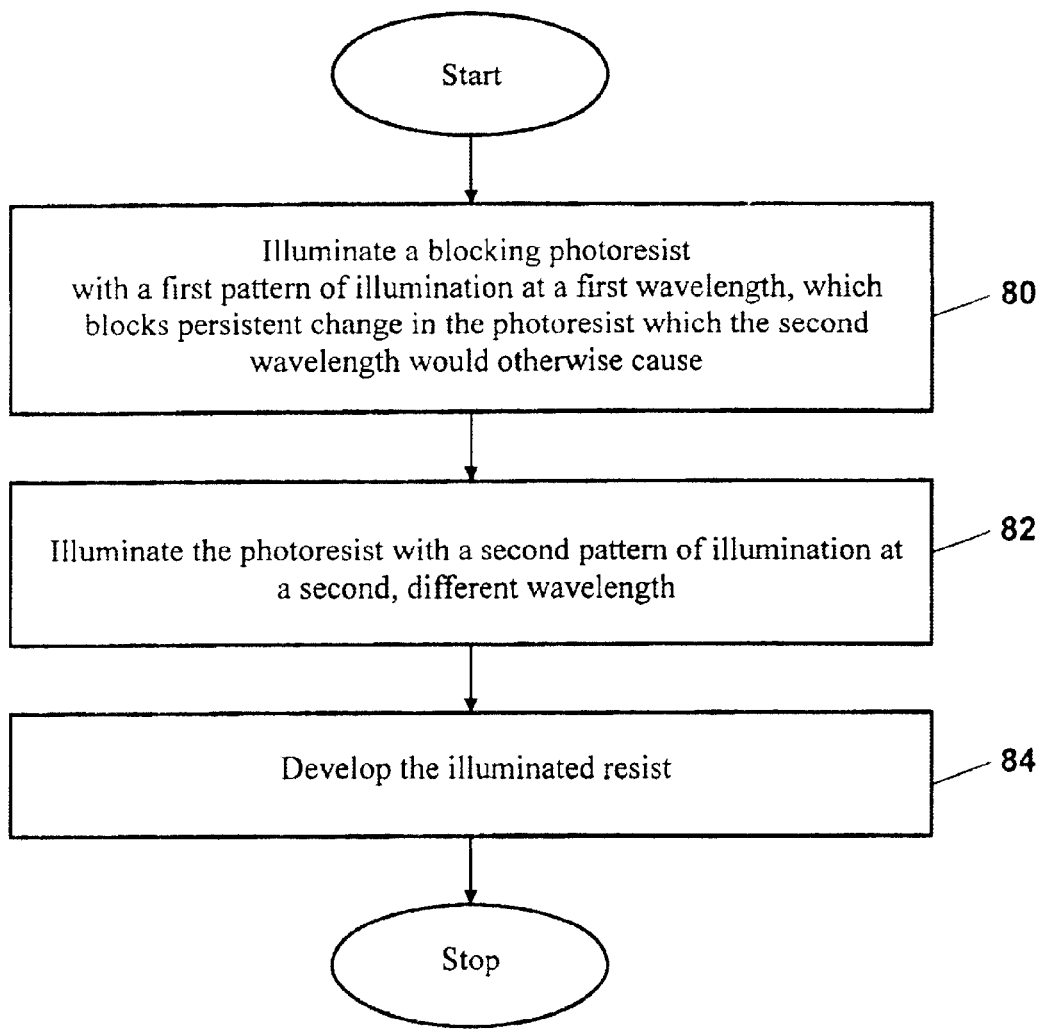
FIG. 8 shows an example illustrative process for exposing a blocking resist.

FIG. 8 illustrates this method. The first step (block 80) is to illuminate the photoresist with a predetermined pattern at a first wavelength (the "blocking wavelength") which prevents light at the second wavelength from catalyzing the resist. For example, it would be possible to use the chromeless PSM technique employed to create the pattern of light distribution shown in FIG. 2 on the photoresist with the blocking wavelength. This pattern of light intensity distribution would prevent light of the second wavelength from catalyzing the resist—except within the central area of sub-threshold illumination.

The second step (block 82) is to illuminate the photoresist with a second pattern of illumination at a second wavelength. The area of illumination with the second wavelength is the same as the area of illumination with the first wavelength. However, light of the second wavelength catalyzes the photoresist only within the narrow region where the intensity of light of the first wavelength is insufficient to block the first wavelength from catalyzing the photoresist.

Figure 9:
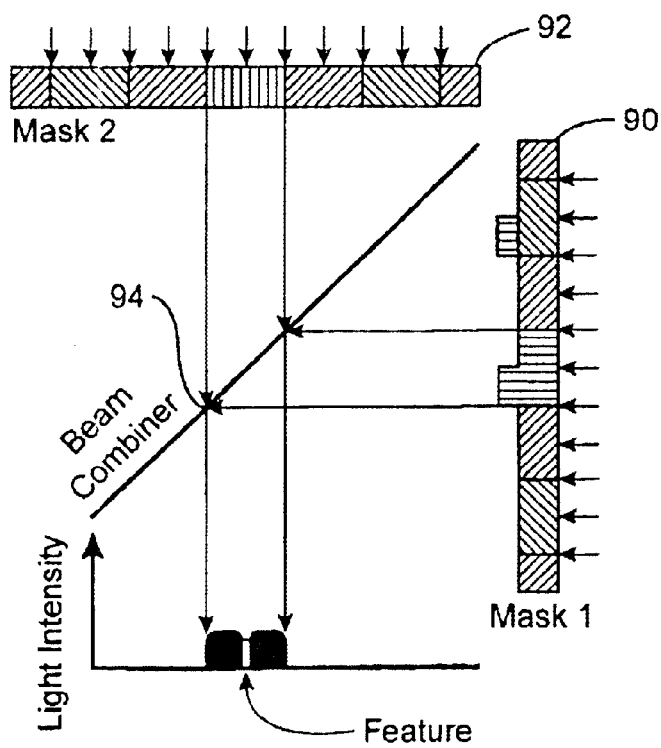
FIG. 9 shows an example illustrative arrangement using two masks to create overlap regions in a blocking resist.

As soon as the light of the blocking wavelength ceases to shine (or after some predetermined relaxation time), the blocking photoresist returns to its original state. Since no residual change in the photoresist remains, it is possible to repeat the process and create another narrow feature very near the first one. FIG. 9 illustrates generically the masks and the substrate required for this method: a first mask (90), a second mask (92), and a beam combiner (94). In both the first illumination step (block 80 of FIG. 8) and the second illumination step (block 82 of FIG. 8), it would be possible to create the illumination patterns with any type of photomask, including a conventional binary chrome-on-quartz mask, a chrome-on-quartz mask with optical proximity correction features, or any type of phase shift mask. It would also be possible to create the illumination patterns with a programmable mask.

Two-Color Photoresists

We now disclose yet another method of inscribing small features on photoresist which requires a "two-color" photoresist; i.e., a photoresist which requires two wavelengths of light to change its solubility.

Figure 10:
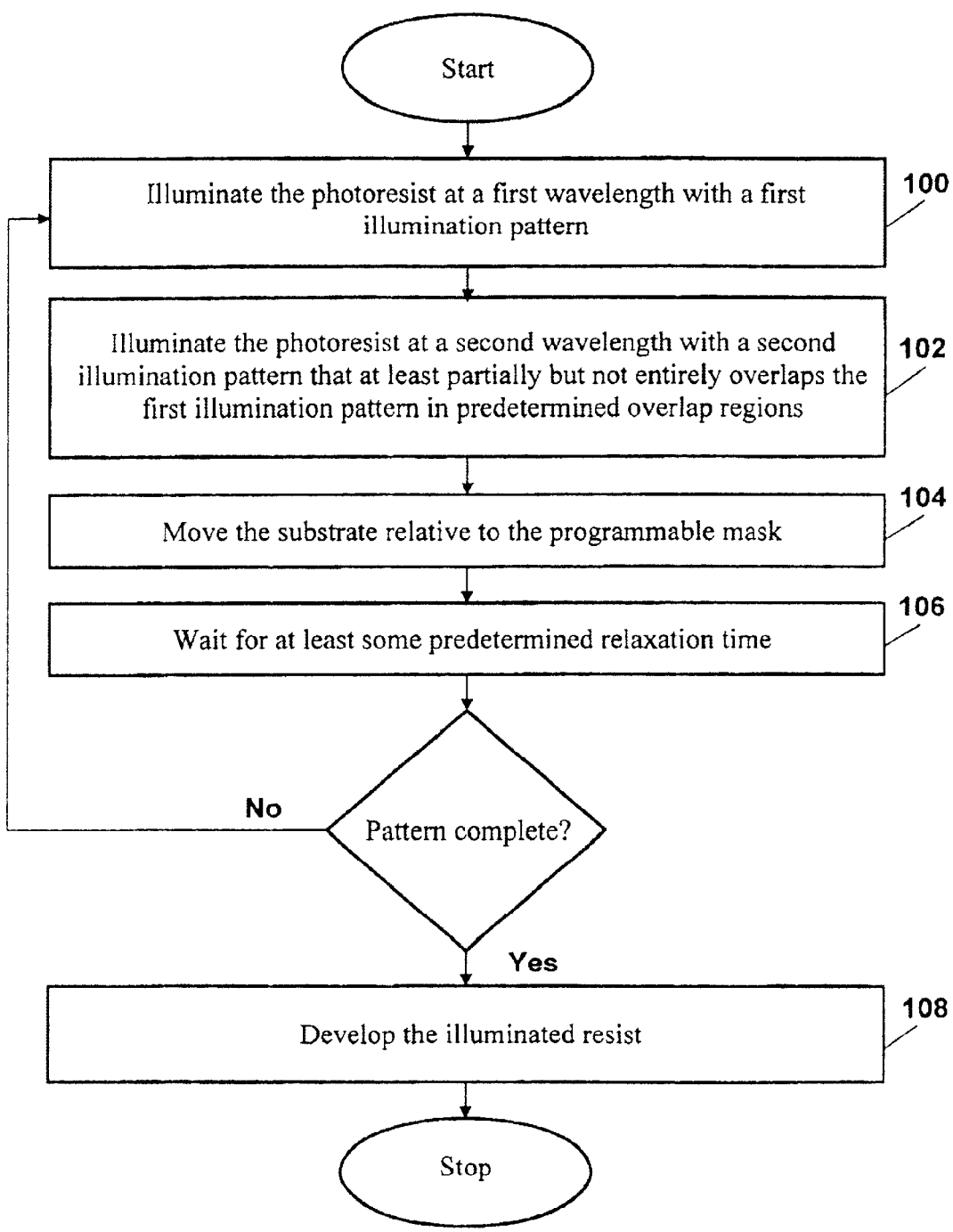
FIG. 10 shows an example illustrative process that uses two masks to expose a two-photon resist.

FIG. 10 shows one non-limiting example of a method of inscribing a complete pattern with one or more photomasks by means of series of exposures onto photoresist which requires illumination with a first and second wavelength:

The first step (block 100) is to illuminate the photoresist at a first wavelength with a first illumination pattern.

The second step (block 102) is to illuminate the photoresist at a second wavelength with a second illumination pattern that at least partially but not entirely overlaps said first illumination pattern in predetermined overlap regions.

The first wavelength and the second wavelength would depend on what the photoresist requires; they might be wavelengths typically used in lithography (e.g., 365 nm, 248 nm, 193 nm, or 157 nm) or any other wavelengths that induced the desired behavior in the photoresist.

The third step (block 104) is to move the substrate relative to the photomask (or photomasks) as part of a strategy to create a complete pattern.

The fourth step (block 106) is to wait for at least the predetermined relaxation time. The predetermined relaxation time is long enough for the areas of resist which didn't receive illumination from both wavelengths to return to their original state. Depending on the properties of the photoresist, it might be the time required for the resist to return from the meta-stable state to their original state. The duration also depends on the properties of the photoresist; it might be zero.

The fifth step is to repeat the first four steps (blocks 100, 102, 104, and 106) as many times as necessary to expose a complete pattern for a device or circuit.

The sixth step (108) is to develop the exposed photoresist.

In this method, the overlap regions of the photoresist acquire a different solubility from the other regions of the photoresist. This method offers the advantages of the overlap exposure method illustrated in FIG. 3 without the requirement of a non-integrative photoresist. The areas on the photoresist which receive illumination from only one wavelength experience either no change or a temporary change. As a result, it's possible not only to inscribe small features on the photoresist by the overlap method, but also to place those features near each other; i.e., to create fully dense integrated circuits. For the photoresist, it would be possible to use commercially available resin (SCR500; JSR, Japan), urethane acrylate monomers, or oligomers as well as photo-initiators. For this resist the two wavelengths could be in the infrared. For example the first wavelength could be ~770 nm and the second could be ~790 nm.

It would be possible to execute this method with one photomask or with two or more photomasks. The photomasks could be of any type, including a conventional binary chrome-on-quartz mask, a chrome-on-quartz mask with optical proximity correction features, any type of phase shift mask, or any type of programmable photomask. If the method is executed with two photomasks, they could be of the same type, or of different types. It would also be possible to execute the method with a programmable mask and an array of apertures.

Figure 11:
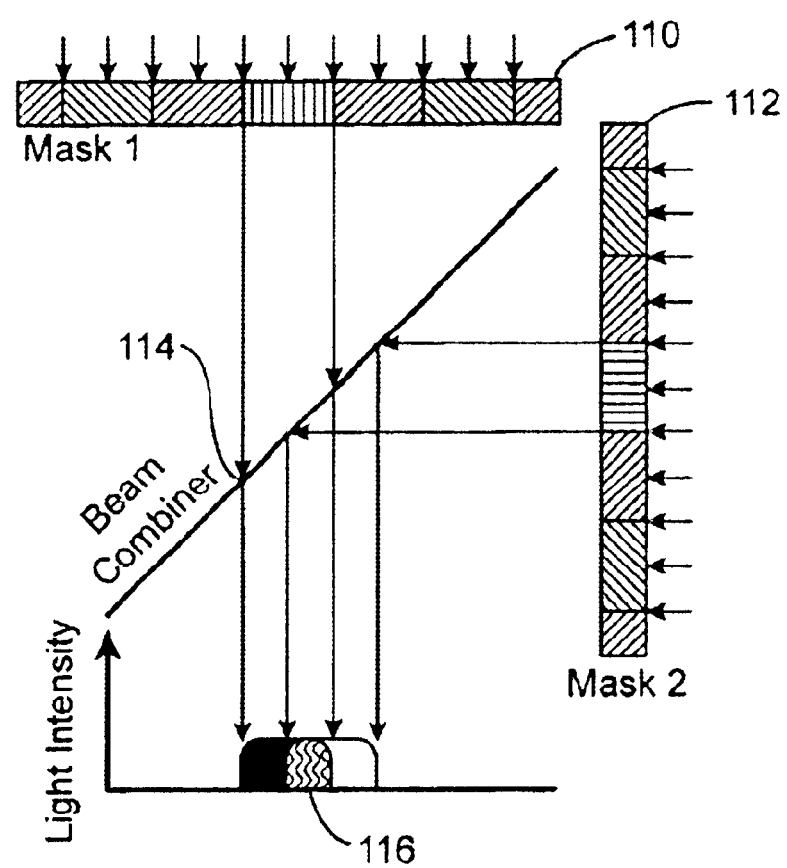
FIG. 11 shows an example illustrative arrangement using two masks to create an overlap region on a two-photon resist.

FIG. 11 illustrates how to execute this method with two photomasks. It shows a first photomask (110), a second photomask (112), a beam combiner (114), and an overlap region (116) on the photoresist.

The two exposures (blocks 100 and 102) can occur either simultaneously or sequentially. If sequentially, the duration of time between the two exposures (blocks 100 and 102) must be less than a predetermined relaxation time. In other words, it's necessary to illuminate with the second wavelength before the effect of the first wavelength wears off.

Two-Photon Photoresists

A two-photon photoresist is a type of integrating photoresist which changes its solubility only by absorbing two photons at a time. A single photon hasn't enough energy to change the solubility of this type of photoresist. Two-photon absorption is a quantum mechanical event which occurs with relatively low probability, compared to one-photon absorption. It occurs only when two photons strike essentially the same location on the photoresist within a narrow window of time. Of course, it will occur more often (i.e., more frequently per unit time) when many photons are present on the surface (i.e., when the intensity of the light is high). As a result, the rate at which the light catalyzes the photoresist is a geometric function of the light intensity.

We propose a unique method which involves two-photon photoresists and a programmable mask that projects a light intensity distribution with side lobes.

When this technique is applied to exposing a complete pattern on a photoresist-coated silicon wafer, the cumulative power from the sidelobes of several pixels over several exposures might catalyze the photoresist in undesirable places. We have already described how non-integrative resists help to overcome that problem.

It is also possible to overcome that problem with a two-photon photoresist. The light in the central peak is much more intense than the light in the side lobes. As a result, two-photon absorption processes are much more likely to occur in the regions of the photoresist illuminated by the central peak than in the regions of the photoresist illuminated by the side lobes. The two-photon resist thus offers a method of preferentially catalyzing the photoresist in the regions illuminated by the central peak. Depending on the precise characteristics of the photoresist, it will be possible to select operating conditions (primarily intensity and time) in which the illumination catalyzes the photoresist in the region of the central peak, but the regions of the photoresist illuminated only by the side lobes receive only a very small amount of sub-threshold exposure. As a result, it will be possible to create densely packed features with a lower probability that cumulative illumination by the side lobes will catalyze the photoresist in undesirable areas.

Figure 12:
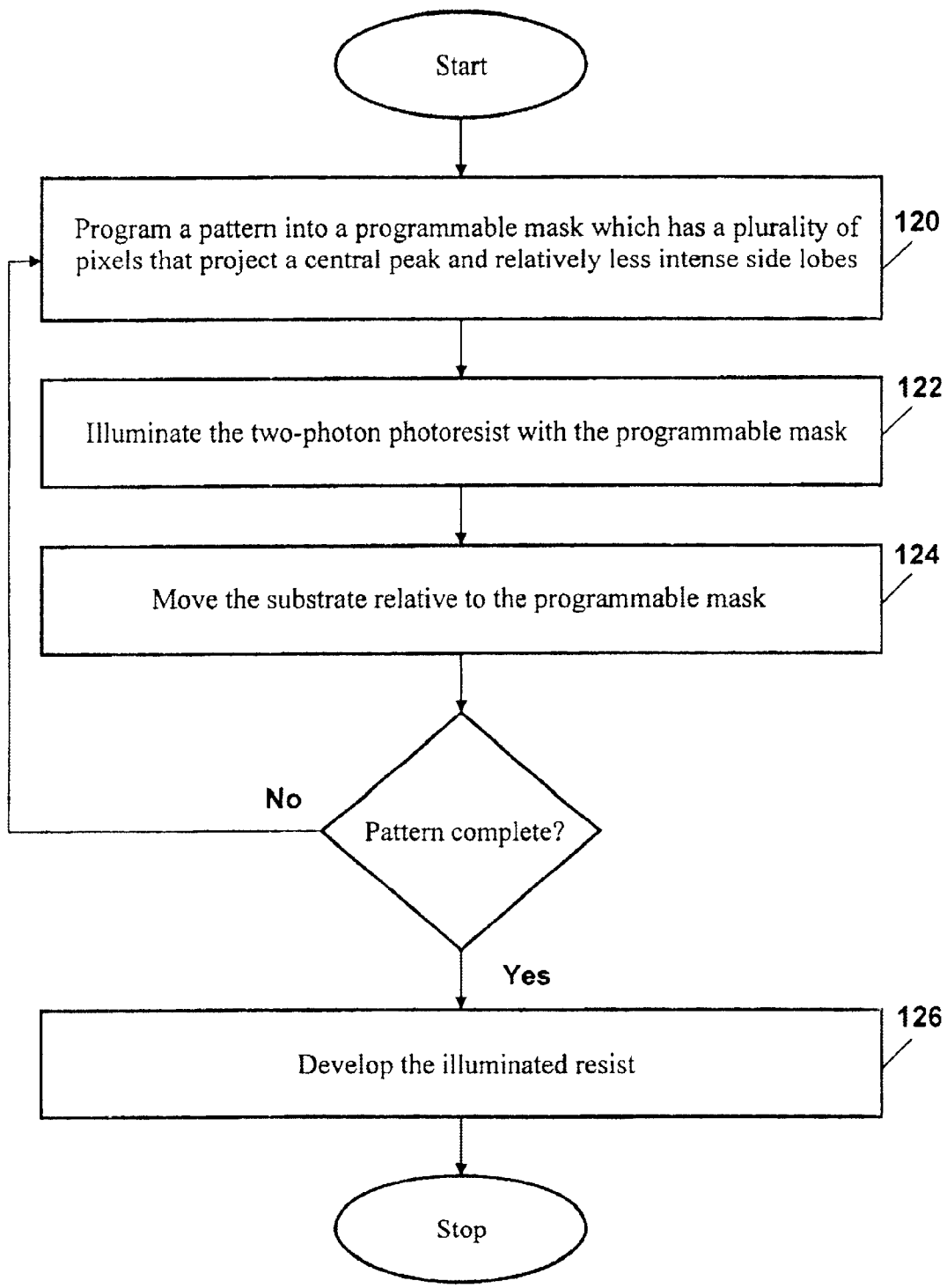
FIG. 12 shows an example illustrative process that uses a single mask to expose a two-photon resist.

FIG. 12 illustrates a method of inscribing a complete pattern on an integrating two-photon photoresist by means of a series of illuminations with a programmable mask with pixels having light intensity pattern at the photoresist consisting of a central peak with relatively high intensity and side lobes with intensities below the intensity of the central peak.

The first step (box 120) is to program the programmable mask.

The second step (box 122) is to illuminate the two-photon photoresist with the programmable mask. The region of the two-photon photoresist illuminated by the central peak will receive light of higher intensity than the regions of the two-photon photoresist illuminated by the side lobes. As a result, the light in the central peak will catalyze the two-photon photoresist, but the regions of the photoresist illuminated by the side lobes will receive only a low dose of sub-threshold exposure.

The third step (box 124) is to move the substrate relative to the programmable mask.

The fourth step is to repeat the first three steps (boxes 120, 122, and 124) as many times as necessary to expose a complete pattern. These subsequent illumination steps can create densely packed features because the regions of the two-photon photoresist illuminated by the side lobes received only a low dose of sub-threshold exposure. Even after several illumination steps, the cumulative illumination in those regions remains sub-threshold. As a result, there is no danger of catalyzing the two-photon photoresist in unwanted areas, and it is possible to create fully dense integrated circuits.

The fifth step (box 126) is to develop the two-photon photoresist.

SUMMARY

We have disclosed specific examples of how a programmable mask could take advantage of different resist properties to improve performance, most importantly resolution. We have also disclosed a framework for understanding and using different resist properties. While the invention has been described in connection with what is presently considered to be the most practical and preferred embodiment, it is to be understood that the invention is not to be limited to the disclosed embodiment. For example, while some of the preferred illustrative embodiments make use of two programmable masks, they could be implemented using a single programmable mask and an array of holes corresponding to the shutters of the programmable mask and a fly's eye lens, or other arrangement to selectively expose the photoresist. As another example, while we prefer to use a programmable mask, it may be possible to use a fixed mask with plural submasks or multiple fixed masks. Thus, the invention is intended to cover various modifications and equivalent arrangements included within the scope of the appended claims.

We claim:

1. A method of catalyzing a photoresist on a substrate comprising:
   a) illuminating said photoresist with a first predetermined pattern of illumination at a first wavelength; and
   b) illuminating said photoresist with a second predetermined pattern of illumination at a second wavelength different from said first wavelength; and
   c) developing said photoresist;
   wherein illumination of said photoresist at said first wavelength backs persistent change within said photoresist that would otherwise occur in response to illumination at said second wavelength.

2. The method of claim 1 wherein at least one of said illuminating steps (a) and (b) is performed using a programmable mask.

3. A method of inscribing a complete pattern with one or more photomasks by means of series of exposures onto photoresist which requires illumination with a first and second wavelength comprising:
   a) illuminating said photoresist at said first wavelength with first illumination pattern;
   b) illuminating said photoresist at said second wavelength with a second illumination pattern that at least partially but not entirely overlaps said first illumination pattern in predetermined overlap regions;
   c) moving said substrate relative to said photomask or photomasks;
   d) waiting for at least some predetermined relaxation time;
   e) repeating steps a) through d) as many times as necessary to expose a complete pattern; and
   (f) developing said exposed photoresist;
   wherein the overlap regions of said photoresist acquire a different solubility from other regions of said photoresist.

4. The method of claim 3 wherein step a) is accomplished with a first programmable mask and step b) is accomplished with a second programmable mask.

5. The method of claim 3 wherein step a) is accomplished with a programmable mask and step b) is accomplished with a array of apertures.

6. The method of claim 3 wherein said illuminating steps a) and b) occur simultaneously.

7. The method of claim 3 wherein said illuminating steps a) and b) occur sequentially.

8. The method of claim 7 wherein the duration of time between said illuminating steps a) and b) is less than a predetermined relaxation time.

* * * * *